US009741571B2

(12) United States Patent
Baburske et al.

(10) Patent No.: US 9,741,571 B2
(45) Date of Patent: Aug. 22, 2017

(54) BIPOLAR TRANSISTOR DEVICE WITH AN EMITTER HAVING TWO TYPES OF EMITTER REGIONS

(71) Applicant: Infineon Technologies AG, Neubiberg (DE)

(72) Inventors: Roman Baburske, Otterfing (DE); Christian Jaeger, Munich (DE); Franz-Josef Niedernostheide, Hagen a. T.W. (DE); Hans-Joachim Schulze, Taufkirchen (DE); Antonio Vellei, Villach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/081,220

(22) Filed: Mar. 25, 2016

(65) Prior Publication Data

US 2016/0284803 A1  Sep. 29, 2016

(30) Foreign Application Priority Data

Mar. 27, 2015  (DE) .......................... 10 2015 104 723

(51) Int. Cl.
*H01L 21/26*  (2006.01)
*H01L 21/268*  (2006.01)
(Continued)

(52) U.S. Cl.
CPC ........ *H01L 21/268* (2013.01); *H01L 21/0465* (2013.01); *H01L 29/0834* (2013.01);
(Continued)

(58) Field of Classification Search
CPC ...................... H01L 29/1095; H01L 29/7395; H01L 21/268
See application file for complete search history.

(56) References Cited

U.S. PATENT DOCUMENTS 5,171,696 A  12/1992  Hagino
5,483,087 A *  1/1996  Ajit .................... H01L 29/7455
257/120
(Continued)

*Primary Examiner* — William Coleman
(74) *Attorney, Agent, or Firm* — Baker Botts L.L.P.

(57) ABSTRACT

Disclosed is a bipolar semiconductor device, comprising a semiconductor body having a first surface; and a base region of a first doping type and a first emitter region in the semiconductor body, wherein the first emitter region adjoins the first surface and comprises a plurality of first type emitter regions of a second doping type complementary to the first doping type, a plurality of second type emitter regions of the second doping type, a plurality of third type emitter regions of the first doping type, and a recombination region comprising recombination centers, wherein the first type emitter regions and the second type emitter regions extend from the first surface into the semiconductor body, wherein the first type emitter regions have a higher doping concentration and extend deeper into the semiconductor body from the first surface than the second type emitter regions, wherein the third type emitter regions adjoin the first type emitter regions and the second type emitter regions, and wherein the recombination region is located at least in the first type emitter regions and the third type emitter regions.

7 Claims, 7 Drawing Sheets

(51) Int. Cl.
*H01L 21/04* (2006.01)
*H01L 29/36* (2006.01)
*H01L 29/66* (2006.01)
*H01L 29/739* (2006.01)
*H01L 29/08* (2006.01)

(52) U.S. Cl.
CPC ........ *H01L 29/36* (2013.01); *H01L 29/66348* (2013.01); *H01L 29/7397* (2013.01)

(56) References Cited

U.S. PATENT DOCUMENTS

| | | | | |
|---|---|---|---|---|
| 6,054,728 A * | 4/2000 | Harada | ............... | H01L 29/0692 257/133 |
| 6,165,848 A * | 12/2000 | Thiemann | ........... | H01L 29/7395 257/E21.385 |
| 7,616,859 B2 * | 11/2009 | Tokura | ................ | H01L 27/0664 257/107 |
| 8,138,542 B2 * | 3/2012 | Yoshikawa | ......... | H01L 29/0634 257/330 |
| 8,384,151 B2 * | 2/2013 | Pfirsch | ................ | H01L 29/0834 257/328 |
| 8,816,355 B2 * | 8/2014 | Onose | ................. | H01L 29/6606 257/329 |
| 9,209,109 B2 * | 12/2015 | Werber | .................... | H01L 23/48 |
| 2015/0021657 A1 | 1/2015 | Ogura et al. | | |

* cited by examiner

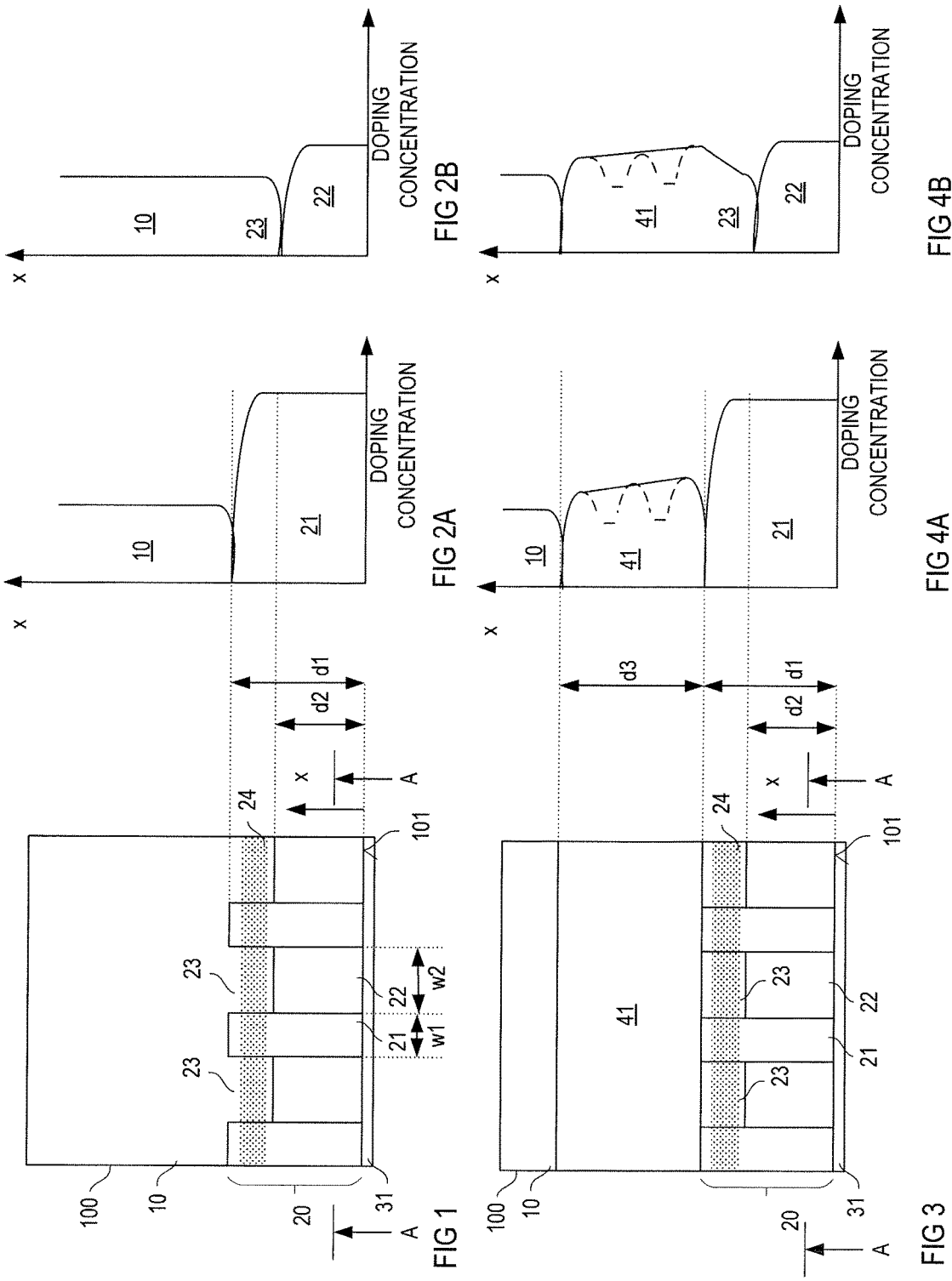

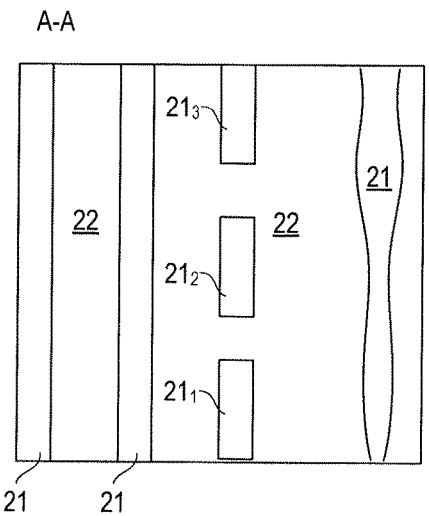
FIG 5
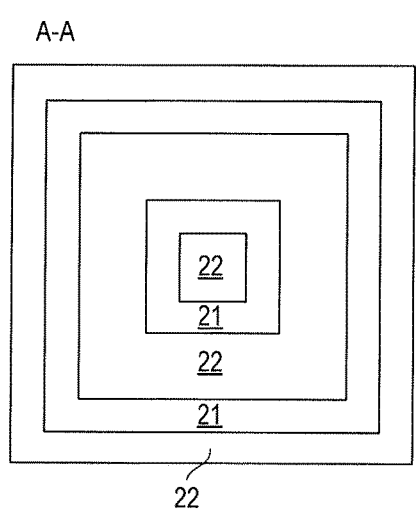
FIG 6
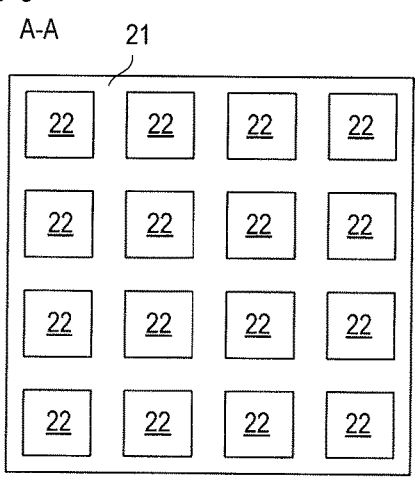
FIG 7
FIG 8
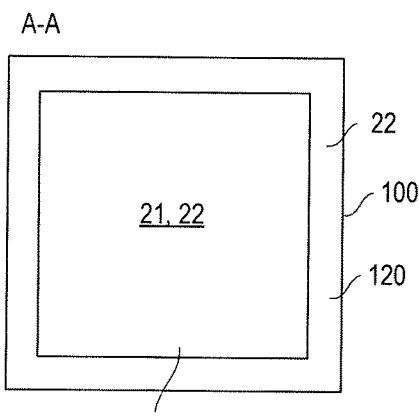
FIG 11

BIPOLAR TRANSISTOR DEVICE WITH AN EMITTER HAVING TWO TYPES OF EMITTER REGIONS

CROSS-REFERENCE TO RELATED APPLICATION

This application claims priority to German Application Serial No. 102015104723.3 filed Mar. 27, 2015 and entitled "Bipolar Transistor Device With an Emitter Having Two Types of Emitter Regions".

This disclosure in general relates to a bipolar transistor device such as, for example, an IGBT (Insulated Gate Bipolar Transistor).

IGBTs (Insulated Gate Bipolar Transistors) are widely used for switching different types of electric loads. For example, IGBTs can be employed in power conversion applications, electric drive applications, or lighting applications, to name only a few.

An IGBT is a voltage controlled MOS transistor device that includes a collector region (often referred to as drain region) and an emitter region (often referred to as source region) that have complementary doping types (conductivity types). An IGBT further includes a gate electrode dielectrically insulated from a body region by a gate dielectric, adjacent the body region, and extending adjacent the body region from the emitter region to a base region (drift region). The base region is arranged between the body region and the collector region. In an on-state of the IGBT the gate electrode generates a conducting channel in the body region between the emitter region and the base region so that the emitter region can inject charge carriers of a first conductivity type into the drift region. At the same time, the collector region injects charge carriers of a second conductivity type into the base region, with the charge carriers of the first and second conductivity types forming a charge carrier plasma in the base region. This charge carrier plasma results in relatively low conduction losses of the IGBT.

Relevant operation parameters of an IGBT are the saturation voltage (often referred to as $V_{CEsat}$), the turn-off switching losses (often referred to as Eoff), and the current robustness (that may also be referred to as short-circuit capability). The latter can either be defined by the current level of the maximum current the IGBT can conduct for a certain amount of time (e.g. 10 µs) without being destroyed, or by the current level which is required to destroy the IGBT. In a conventional IGBT design, there is a tradeoff between the saturation voltage and the switching losses such that the switching losses increase as the saturation voltage decreases, and vice versa. Further, there is a tradeoff between the switching losses and the current robustness such that the current robustness increases as the switching losses increase.

Thus, there is a need to increase the current robustness of a bipolar semiconductor device, such as an IGBT.

One embodiment relates to a bipolar semiconductor device. The bipolar semiconductor device includes a semiconductor body having a first surface, and a base region of a first doping type and a first emitter region in the semiconductor body. The first emitter region adjoins the first surface and includes a plurality of first type emitter regions of a second doping type complementary to the first doping type, a plurality of second type emitter regions of the second doping type, a plurality of third type emitter regions of the first doping type, and a recombination region including recombination centers. The first type emitter regions and the second type emitter regions extend from the first surface into the semiconductor body. The first type emitter regions have a higher doping concentration and extend deeper into the semiconductor body from the first surface than the second type emitter regions, the third type emitter regions adjoin the first type emitter regions and the second type emitter regions, and the recombination region is located at least in the first type emitter regions and the third type emitter regions.

Another embodiment relates to a method for producing an emitter region in a bipolar semiconductor device. The method includes, in a first implantation process, implanting dopant atoms of a first conductivity type into first surface sections of a first surface of a semiconductor body, and covering second surface sections of the first surface during the implanting; in a first activation process, activating at least a part of the dopant atoms implanted in the first implantation process to form first doped regions below the first surface sections; in a second implantation process, implanting dopant atoms of the first conductivity type into the first surface sections and the second surface sections; and in a second activation process, activating only a part of the dopant atoms implanted in the second implantation process to form second doped regions and recombination regions such that the recombination regions are more spaced apart from the second surface regions than the second doped regions.

Examples are explained below with reference to the drawings. The drawings serve to illustrate certain principles, so that only aspects necessary for understanding these principles are illustrated. The drawings are not to scale. In the drawings the same reference characters denote like features.

FIG. 1 shows a vertical cross sectional view of one section of a semiconductor body that includes a first emitter region of a bipolar semiconductor device, according to one embodiment;

FIGS. 2A-2B illustrate doping concentrations of the semiconductor regions shown in FIG. 1;

FIG. 3 shows a vertical cross sectional view of one section of a semiconductor body that includes a first emitter region and a field-stop region, according to one embodiment;

FIGS. 4A-4B illustrate doping concentrations of the semiconductor regions shown in FIG. 3;

FIG. 5 shows elongated first type emitter regions and elongated second type emitter regions of the first emitter region in a horizontal plane of the semiconductor body;

FIG. 6 shows ring-shaped first type emitter regions and ring-shaped second type emitter regions of the first emitter region in a horizontal plane of the semiconductor body;

FIG. 7 shows grid-shaped first type emitter regions and rectangular second type emitter regions of the first emitter region in a horizontal plane of the semiconductor body;

FIG. 8 shows rectangular first type emitter regions and rectangular second type emitter regions of the first emitter region in a horizontal plane of the semiconductor body;

FIG. 11 illustrates an inner region and an edge region of the semiconductor body;

Figure 9:
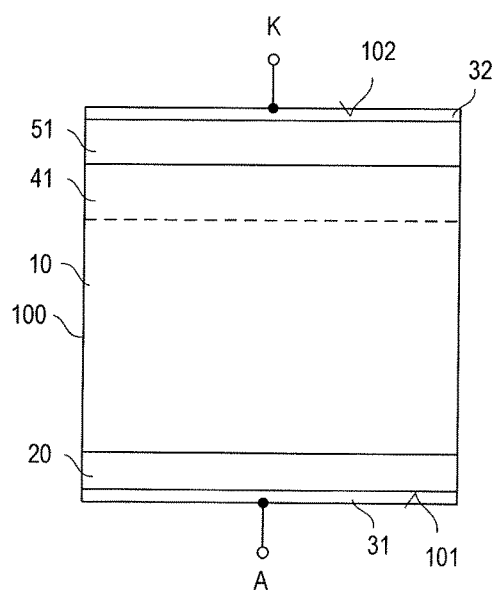
FIG. 9 shows a vertical cross sectional view of a bipolar semiconductor device implemented as a diode.

FIG. 1 shows a vertical cross sectional view of one section of a bipolar semiconductor device. Referring to FIG. 1, the semiconductor device includes a semiconductor body 100 with a first surface 101. The semiconductor body 100 further includes a second surface opposite the first surface 101. However, this second surface is out of view in FIG. 1. FIG. 1 shows a vertical cross sectional view of the semiconductor body 100, that is, a view in a section plane that is perpendicular to the first surface 101. The semiconductor body 100 may include a conventional semiconductor material such as silicon (Si), silicon carbide (SiC), gallium arsenide (GaAs), gallium nitride (GaN), or the like. In the following, examples of doping concentrations and dopant doses relate to a semiconductor body 100 including silicon. However, these doping concentrations and dopant doses may easily be adapted to a semiconductor body 100 including a material other than silicon. For example, the doping concentrations and doses mentioned in the following may easily be adapted to use in a semiconductor body including SiC by multiplying the mentioned doping concentrations with 10 (1E1). Likewise, dimensions mentioned in the following relate to a semiconductor device including a semiconductor body based on silicon. If these dimensions relate to dimensions in a current flow direction of the device, these dimensions may easily be adapted to the use in a semiconductor body based on SiC by dividing the mentioned dimensions through 10 (1E1).

The semiconductor devices includes a base region 10 (which may also be referred to as a drift region) of a first doping type (conductivity type), and a first emitter region 20. The first emitter region 20 adjoins the first surface 101 and includes a plurality of first type emitter regions 21 and a plurality of second type emitter regions 22. The first type emitter regions 21 and the second type emitter regions 22 are doped regions of a second doping type complementary to the first doping type. The first emitter region 20 further includes a plurality of third type emitter regions 23 of the first doping type and a recombination region 24 that includes recombination centres. Each of the plurality of first type emitter regions 21 and each of the plurality of second type emitter regions 22 extends from the first surface 101 into the semiconductor body 100. The semiconductor device may further include a first electrode 31 on the first surface 101. This first electrode 31 contacts the first type emitter regions 21 and the second type emitter regions 22. According to one embodiment, doping concentrations of the first type emitter regions 21 and the second type emitter regions 22 at the first surface 101 are such that there is an ohmic contact between the first electrode 31 and these regions 21, 22

The first type emitter regions 21 extend deeper into the semiconductor body 100 than the second type emitter regions 22. In FIG. 1, d1 denotes a dimension of the first type emitter regions 21 in the vertical direction of the semiconductor body 100. The "vertical direction" of the semiconductor body 100 is a direction perpendicular to the first surface 101. Similarly, d2 denotes a dimension of the second type emitter regions 22 in the vertical direction of the semiconductor body 100. According to one embodiment, d1 is between 100 nanometers (nm) and 2 micrometers (µm), particularly between 300 nm and 1 µm, and d2 is between 50 nm and 1 µm, particularly between 60 nm and 300 nm. A ratio d1/d2 between these dimensions of the first type emitter regions 21 and the second type emitter regions 22, respectively, is, for example, between 1.5 and 5 and, in particular, between 2 and 4. Furthermore, an electrically active doping concentration of the first type emitter regions 21 is higher than an electrically active doping concentration of the second type emitter regions 22, or an electrically active dopant dose of the first type emitter regions 21 is higher than an electrically active dopant dose of the second type emitter regions 22. The "electrically active doping concentration" defines the number of activated dopant atoms per volume (usually per $cm^3$), and the "electrically active dopant dose" denotes the overall number of activated dopant atoms that were introduced into a predefined surface area (usually 1 $cm^2$) of the first surface 101 of the respective first type or second type emitter region. "Activated dopant atoms" are electrically active dopant atoms that are incorporated into the crystal lattice of the semiconductor body 100 so that these dopant atoms can contribute to the electrical conduction (that is, provide electrons in case of n-type dopants and receive electrons in case of p-type dopants). Unless stated otherwise, "doping concentration" as used herein means electrically active doping concentration.

According to one embodiment, a maximum doping concentration in the first type emitter region 21 is between $1.5E16\ cm^{-3}$ and $1.5E20\ cm^{-3}$, particularly between $1E17\ cm^{-3}$ and $1E19\ cm^{-3}$, or between $2E17\ cm^{-3}$ and $2E18\ cm^{-3}$. The maximum doping concentration in the second type emitter region 22 is between $1E16\ cm^{-3}$ and $1E19\ cm^{-3}$, particularly between $3E16\ cm^{-3}$ and $1E18\ cm^{-3}$, or between $1E17\ cm^{-3}$ and $1E18\ cm^{-3}$. Let N21/N22 be a ratio between the doping concentration in the first type emitter region 21 and the doping concentration in the second type emitter region 22. According to one embodiment, this ratio N21/N22 is between 1.5 and 1E4, between 2 and 100, or between 2.5 and 10.

Referring to FIG. 1, the third type emitter regions 23 adjoin the first type emitter regions 21 and the second type emitter regions 22. More particularly, each of the plurality of third type emitter regions 23 adjoins one of the second type emitter regions 22 in the vertical direction of the semiconductor body 100 and is located between two neighboring first type emitter regions 21. The recombination region 24 is located in the first type emitter regions 21 and the third type emitter regions 23. Optionally, sections of the recombination region 24 are also located in the second type emitter regions 22. That is, the recombination region 24 may extend into the second type emitter regions. This, however, is not shown in FIG. 1. In the embodiment shown in FIG. 1, the recombination region 24 is located in the first type emitter regions 21, but is not located in those sections of the base region 10 (or the field-stop region 41, see FIG. 3) adjoining the first type emitter regions 21 in the current flow direction. The "current flow" direction is the vertical direction of the semiconductor body in the embodiment shown in FIG. 1.

FIG. 2A schematically illustrates the doping concentration of one of the first type emitter regions 21 and the base region 10 along a line that extends in the vertical direction of the semiconductor body 100. FIG. 2B schematically illustrates the doping concentration of one of the plurality of second type emitter regions 22 and the base region 10 along a line that extends in the vertical direction of the semiconductor body 100. Referring to FIGS. 2A and 2B, the doping concentration of the first type emitter regions 21 is higher than the doping concentration of the second type emitter regions 22, and the doping concentration of the second type emitter regions 22 is higher than the doping concentration of the base region 10. For example, the doping concentration is selected from a range of between 5E12 cm$^{-3}$ and 5E14 cm$^{-3}$.

Referring to FIG. 3, which also shows a vertical cross sectional view of the bipolar semiconductor device, the bipolar semiconductor device may further include a field stop region 41. The field stop region 41 is arranged between the base region 10 and the first emitter region 20 and has the same doping type as the base region 10. The field stop region 41 has a higher doping concentration than the base region 10. According to one embodiment, the field stop region 41 is implemented such that a peak doping concentration is selected from a range of between 5E14 cm$^{-3}$ and 5E15 cm$^{-3}$. A dopant dose of the field-stop region 41 is, for example, between 0.5E12 cm$^{-2}$ and 1E12 cm$^{-2}$.

A doping profile of the field stop region 41 in the vertical direction of the semiconductor body 100 can be selected from several different doping profiles. According to one embodiment, the doping concentration of the field stop region 41 is substantially constant in the vertical direction between the base region 10 and the first type emitter regions 21. This is schematically illustrated in FIG. 4A that schematically illustrates the doping concentration in one of the first type emitter regions 21 and the adjoining field stop region 41. According to another embodiment (illustrated in dashed lines in FIG. 4A) the field stop region's 41 doping profile has two or more doping maxima. The maximum doping concentration in each of these maxima is higher than the doping concentration of the base region 10. A minimum doping concentration between two of these maxima can be higher than the doping concentration of the base region 10, substantially equal the doping concentration of the base region 10, or lower than the doping concentration of the base region 10. According to one embodiment, these maxima have different peak concentrations, whereas the peak concentration decreases as the distance of the respective maximum to the first surface 101 increases.

Referring to FIG. 4B, which illustrates the doping concentration along a vertical line going through one of the second type emitter regions 22, the third type emitter region 23, the field stop region 41 and the base region 10, the doping concentration in the second type emitter regions 23 may decrease towards the second type emitter regions 22. That is, the third type emitter regions 23 may have their maximum doping concentration in a region where they adjoin the field stop region 41 and their minimum doping concentration in a region where they adjoin the second type emitter regions 22. According to another embodiment, the field-stop region 41 extends into the third type emitter region 23. For example, the field-stop region 41 may have its maximum doping concentration in a region where the field-stop region 41 adjoins the second type emitter region 22.

In the horizontal plane of the semiconductor body 100 there are different ways to design the first type emitter regions 21 and the second type emitter regions 22, respectively. Some examples are explained with reference to FIGS. 5-8 below. Each of these figures shows a horizontal cross sectional view of one section of the semiconductor body 100. In particular, FIGS. 5-8 each show a section of the semiconductor body 100 in a horizontal section plane A-A going through the first type emitter regions 21 and the second type emitter regions 22. The position of the horizontal section plane A-A in the semiconductor body 100 is shown in FIGS. 1 and 3.

Referring to FIG. 5, both the first type emitter regions 21 and the second type emitter regions 22 can be elongated semiconductor regions. In FIG. 5, several embodiments of how the elongated first type emitter regions 21 can be implemented are shown. According to one embodiment, the first type emitter regions 21, in their longitudinal direction, are contiguous. According to another embodiment, one elongated region 21 includes two or more elongated sub-regions $21_1$, $21_2$, $21_3$ that are spaced apart in their longitudinal direction. According to one embodiment, the elongated first type emitter regions have substantially a constant width along the longitudinal direction. According to another embodiment, the width varies along the longitudinal direction between a minimum width and a maximum width. According to one embodiment, the maximum width is twice the minimum width. More generally, a ratio between the maximum width and the minimum width is between 1.5 and 100, in particular between 1.8 and 10.

The first type emitter regions 21 in one device may be implemented with the same shape, for example, with one of the shapes shown in FIG. 5. However, it is also possible to implement first type emitter regions with different shapes in one device.

According to another embodiment, shown in FIG. 6, the first type emitter regions 21 and the second type emitter regions 22 are implemented as concentric rings. In the embodiment shown in FIG. 6, the center is formed by one second type emitter region 22. However, this is only an example. It is also possible to have a first type emitter region 21 in the center of the plurality of concentric rings. Just for the purpose of illustration, the concentric rings shown in FIG. 6 are rectangular rings. It should be noted that any other type of concentric rings such as, for example, circular rings, elliptical rings, polygonal rings, or the like, may be used as well.

In the embodiment shown in FIG. 7, the plurality of the first type emitter regions 21 form a grid-shaped semiconductor region which surrounds the plurality of second type emitter regions 22. In this embodiment, the second type emitter regions 22 have a rectangular shape. However, this is only an example. The second type emitter regions 22 could be implemented with an elliptical shape, a circular shape, a polygonal shape, or the like, as well. It is even possible to have several different shapes of the first type emitter regions 21 and the second type emitter regions 22 in one semiconductor devices.

According to another embodiment (not shown) the plurality of second type emitter regions 22 form a grid-shaped semiconductor region that surrounds the plurality of first type emitter regions 21.

According to yet another embodiment shown in FIG. 8, each of the plurality of first type emitter regions 21 and each of the plurality of second type emitter regions 22 has a rectangular shape so that the overall arrangement of the first type emitter regions 21 and the second type emitter regions 22 resembles a checkerboard.

According to one embodiment, the first type emitter regions 21 and the second type emitter regions 22 are implemented such that in the first surface 101 a ratio between an overall area of the first type emitter regions 21 and an overall area of the second type emitter regions 22 is between 0.05 and 5, in particular between 0.1 and 1.

The topology with the first emitter region 20, the base region 10, and the optional field stop region 41 explained herein before can be implemented in any type of bipolar semiconductor device such as, for example, a diode, an IGBT, a BJT (Bipolar Junction Transistor), or a thyristor.

FIG. 9 schematically illustrates a vertical cross sectional view of a bipolar diode implemented with the first emitter region 20 of the type explained before. In FIG. 9 (as well as in FIG. 10 explained below) the first emitter region 20 is only schematically illustrated. For details of the first emitter region 20 reference is made to FIGS. 1-8 explained herein before. Besides the first emitter region 20 and the base region 10 the diode shown in FIG. 9 includes a second emitter region 51 of the first doping type. The second emitter region 51 adjoins the base region 10 and has higher doping concentration than the base region 10. According to one embodiment, a doping concentration of the base region 10 is between 5e12 cm$^{-3}$ and 5e14 cm$^{-3}$ (for silicon devices) while the doping concentration of the second emitter region 51 is between 1E19 cm$^{-3}$ and 1E21 cm$^{-3}$ The second emitter region 51 is in the region of the second surface 102 of the semiconductor body 100. A second electrode 32 is arranged on the second surface 102 and ohmically contacts the second emitter region 51. In the diode, the optional field-stop region 41 is arranged between the second emitter region 51 and the base region 10.

According to one embodiment, the first doping type (the doping type of the base region 10, the second emitter region 51 and the optional field stop region 41) is an n-type, and the second type (the doping type of the first type emitter regions 21 and the second type emitter regions 22) is a p-type. In this embodiment, the first electrode 31 forms an anode A of the diode, and the second electrode 32 forms a cathode K of the diode.

Figure 10:
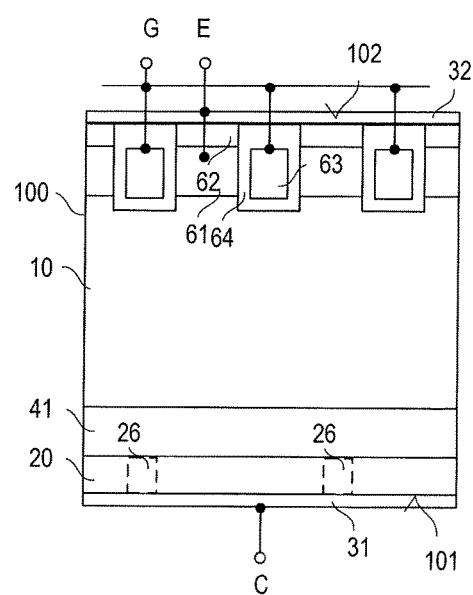
FIG. 10 shows a vertical cross sectional view of a bipolar semiconductor device implemented as an IGBT.

FIG. 10 illustrates a vertical cross sectional view of an IGBT. The IGBT besides the first emitter region 20, the base region 10, and the optional field stop region 41 includes at least one transistor cell with a second emitter region 62 of the first doping type, a body region 61 of the second doping type, and a gate electrode 63. The gate electrode 63 is adjacent the body region 61 and is dielectrically insulated from the body region 61 by a gate dielectric 64. In FIG. 10, several such transistor cells are shown. The overall IGBT may include several thousand, several ten thousand, several hundred thousand, or more transistor cells. The individual transistor cells are connected in parallel by having the second emitter regions 62 (which may also be referred to as source regions) connected to the second electrode 32. The second electrode 32 forms an emitter node (emitter terminal) E of the IGBT. The first electrode 31 forms a collector C of the IGBT. The gate electrodes 63 are connected to a common gate anode G. This connection of the gate electrodes 61 to the gate anode G is only schematically illustrated in FIG. 10. Although the gate electrodes 63 are drawn as separate electrodes in FIG. 10, it should be noted that these gate electrodes 63 can be sections of one contiguous gate electrode having a grid shape in the horizontal plane of the semiconductor body 100. According to one embodiment, in the IGBT shown in FIG. 10, the first doping type (the doping type of the base region 10, the optional field stop region 41 and the second emitter regions 62) is an n-type, and the second doping type (the doping type of the first type emitter regions 21, the second type emitter regions 22, and the body regions 61) is a p-type. The field stop region may be part of the n-type third emitter region 23.

According to one embodiment, the IGBT is implemented as a reverse-conducting IGBT (RC-IGBT). In this case, the emitter region 20 includes semiconductor regions (emitter shorts) 26 (illustrated in dotted lines in FIG. 10) of the first doping type that extend from the first surface 101 through the emitter region 20 to or into the base region 10 or the field-stop region, respectively.

FIG. 10 only shows sections of the IGBT. Those regions of the IGBT where the transistor cells are located can be referred to as active devices region. According to one embodiment, the first emitter 20 with the first type emitter regions 21, the second type emitter regions 22, and the third type emitter regions 23 is located only below the active device region. This is explained with reference to FIG. 11. FIG. 11 shows an overall cross sectional view of a semiconductor body 100 in which the bipolar semiconductor device is integrated. Referring to FIG. 11, the semiconductor body 100 includes an inner region 110 (active region) and an edge region 120. The edge region 120 may be arranged between an edge of the semiconductor body 100 and the inner region 110 (as shown). Alternatively, the edge region is located between the active region 110 of the bipolar semiconductor and the active region of another semiconductor device (not shown) integrated in the same semiconductor body. The "edge" of the semiconductor body 100 is a horizontal surface that terminates the semiconductor body 100 in horizontal directions.

As schematically illustrated in FIG. 11, only in the inner region both the first type emitter regions 21 and the second type emitter regions 22 are located. In the edge region 120, at least the first type emitter regions 21 are omitted. According to one embodiment, the first emitter 20 is omitted in the edge region 120. In this case, a doping concentration in the edge region 120 may correspond to the doping concentration in the base region 10. According to another embodiment, in the edge region, the first emitter 20 includes a second type emitter region 22, the third type emitter region 23, and the recombination region 24. Both of these alternatives provide for a lower carrier density in the edge region 120 compared to the inner region 110 so that the risk of a dynamic avalanche in case of turning-off the device is reduced and the turn-off ruggedness is improved. According to another embodiment, the edge region 120 includes a first emitter 20 with first type emitter regions 21 and second type emitter regions 22, whereas these regions 21, 22 are implemented such that in the edge region a ratio between an overall area of the of the first type emitter regions 21 and the second type emitter regions 22 is smaller in the edge region 120 than in the inner region 110. For example, in a device as shown in FIGS. 1 and 2, this may be obtained by increasing w2 in the edge region 12 as compared to the inner region 110 and/or by reducing w1 in the edge region 120 as compared to the inner region. Optionally, these design measures that reduce the current density in the edge region 120 may also be implemented in a transition region between the inner region 110 and the edge region 120, so that this transition region extends into the inner region 110 up to 3 times the minority carrier diffusion length, or up to 1.5 times the minority carrier diffusion length. For example, in an IGBT the minority carrier diffusion length may be substantially equal a length (thickness) of the drift region 10 in the current flow direction.

For the purpose of explanation it is assumed that the first doping type is an n-type and the second doping type is a p-type. The diode shown in FIG. 9 can be operated in a forward biased mode and a reverse biased mode. In the forward biased mode, a voltage is applied between the anode A and the cathode K that forward biases a pn-junction between base region 10 and the first type and second type emitter regions 21, 22 of the first emitter 20 (this voltage being a positive voltage if the first doping type is an n-type).

In this operation mode, the first emitter 20 injects second type charge carriers (holes) into the base region 10 and the second emitter 51 injects first type charge carriers (electrons) into the base region 10. The first type charge carriers and the second type charge carriers injected into the base region 10 form a charge carrier plasma which provides for low conduction losses of the diode. In the reverse biased mode, a (negative) voltage is applied between the anode A and the cathode K so that a pn-junction between the first type and second type emitter regions 21, 22 and the base region 10 (and the third type emitter regions 23, respectively) is reverse biased. In this case, a depletion region (space charge region) expands in the base region 10 so that a current flow through the diode is prevented.

In context with the IGBT, only the forward biased mode will be explained in further detail. The IGBT is in the forward biased mode when a positive voltage is applied between the collector C and the emitter E. In the forward biased mode, the IGBT can be operated in an on-state and an off-state. In the on-state, the gate electrodes 63, by receiving a suitable drive potential via the gate electrode G, are driven such that they generate conducting channels in the body regions 61 between the second emitter regions 62 (source regions) and the base region 10. Via these conducting channels, the second emitter regions 62 inject first type charge carriers (electrons) into the base region 10, while the first emitter region 20 injects second type charge carriers (holes) into the base region 10. In the off-state, the gate electrodes 63 are driven such that conducting channels in the body regions 61 between the second emitter regions 62 and the base region 10 are interrupted. In this case, by virtue of the positive voltage applied between the collector C and the emitter E, a depletion region (space charge region) expands in the base region 10 beginning at a pn-junction between the base region 10 and the body regions 61. In a manner not illustrated in detail in FIG. 10 the body regions 61, like the second emitter regions 62, are connected to the second electrode 32 and the emitter E, respectively.

In the following, the functionality of the first emitter 20 in the on-state of the IGBT (which corresponds to the forward biased state of the diode) is explained in greater detail. In this context, reference is made to FIGS. 1 and 3, in which the first emitter 20 and the adjoining device regions are shown in detail. It should be noted that the following explanation is based on a simplified model and focuses on the most relevant aspects. In the on-state, the first type emitter regions 21 inject second type charge carriers directly into the base region 10 (see FIG. 1) or through the optional field stop region 41 into the base region 10 (see FIG. 3). The second type emitter regions 22 inject second type charge carriers through the third type emitter regions 23 into the base region 10 or through the third type emitter regions 23 and the field stop region 41 into the base region 10.

In the on-state of the IGBT, a current level of a current through the IGBT may be defined by a load (not shown) connected in series with the collector-emitter path C-E of the IGBT, wherein the series circuit with the load and the IGBT is connected to a supply voltage source. Dependent on an operation load of the load, the current level may vary between relatively low levels such as, for example, several 100 milliamperes (mA) and high levels such as, for example, several 10 amperes (A). For example, high current levels (i.e. current levels larger than several times the nominal current) may occur when there is a short circuit in the load. In the following, a current level the IGBT can withstand without being destroyed will be referred to as maximum current level. Further, an operation mode in which the current level is below a pre-defined current threshold will be referred to as normal mode, and an operation mode in which the current level is between the pre-defined level and the maximum level will be referred to as high-current mode.

As will be explained below, the first emitter 20 helps to achieve low switching losses in the normal operation mode, and helps to reach a high maximum current level in the high-current mode. In the normal operation mode, mainly the second type emitter regions 22 inject charge carriers into the base region 10 while the first type emitter regions 21 inject less charge carriers than the second type emitter regions. The reason for this is explained below.

Between the first type emitter regions 21 and the base region 10 or the field-stop region 41, respectively, there are first pn-junctions; and between the second type emitter regions 22 and the third type emitter regions 23 there are second pn-junctions. Each of these pn-junctions has a built-in voltage $V_{bi}$.

The built-in voltage of a pn-junction is given by $$V_{bi} = \frac{kT}{q} \ln \frac{N_A N_D}{n_i^2} \tag{1}$$

(see, S. M. Sze: "Semiconductor Devices, Physics and Technology", page 73, Jon Wiley & Sons, 1985, ISBN 0-471-87424-8), where k is the Boltzmann constant, T is the absolute temperature, q is the elementary charge, ln is the natural logarithm, $N_A$ is the doping concentration of the p-type (acceptor) layer adjoining the pn-junction, $N_D$ is the doping concentration of the n-type (donator) layer adjoining the pn-junction, and $n_i$ is the intrinsic doping of the semiconductor material used to implement the pn-junction. For example, $n_i$ is about $1.45E10$ cm$^{-3}$ in silicon at room temperature. Charge carriers can flow across the pn-junction when a positive voltage is applied between the p-type region and the n-type region and when the voltage level of this voltage is higher than the built-in voltage.

Based on equation (1), a built-in voltage $V_{bi1}$ of the first pn-junctions is defined by doping concentrations $N_{A1}$ and $N_{D1}$ of those regions forming the first pn-junctions. For the purpose of explanation it is assumed that the second doping type of the first type emitter regions 21 and the second type emitter regions 22 is a p-type. In this case, $N_{A1}$ denotes the doping concentration of the first type emitter regions 21, and $N_{D1}$ denotes the doping concentration of the base region 10 (if there is no field-stop region) or of those sections of the field-stop region 41 adjoining the first type emitter regions 21 (if there is a field-stop region). Consequently, a built-in voltage $V_{bi2}$ of the second pn-junctions is defined by a doping concentration $N_{A2}$ of the second type emitter regions 22 and a doping concentration $N_{D2}$ of the third type emitter regions 23. Referring to the explanation above the first type emitter regions 21 have a higher doping concentration than the second type emitter regions 22, that is, $$N_{A1} > N_{A2} \tag{2}$$

Furthermore, the doping concentration of those regions of the third type emitter regions 23 that adjoin the second type emitter regions 22 may be equal to the doping concentration of the base region 10 (if there is no field-stop zone), may be equal to the doping concentration of those field-stop region 41 sections adjoining the first type emitter regions 21, may be lower, or may even be higher than the doping concentration of those field-stop region 41 sections adjoining the first type emitter regions 21. That is, in any case, $$N_{D1} \geq N_{D2} \quad (3a)$$

or $$N_{D1} < N_{D2} \quad (3b).$$

Referring to equations (1)-(2) and (3a) the built-in voltage $V_{bi1}$ of the first pn-junctions may be higher than the built-in voltage $V_{bi2}$ of the second pn-junctions, that is, $$V_{bi1} > V_{bi2} \quad (4).$$

If, referring to equation (3b) $N_{D1} < N_{D2}$, then $N_{A1}$ may be chosen high enough relative to $N_{A2}$ so that equation (4) is met.

The current driven through the IGBT by the load is associated with a voltage across the first pn-junctions and the second pn-junctions. A current through the IGBT starts to flow when the voltage across the second pn-junctions reaches the second built-in voltage $V_{bi2}$. At this time, the second type emitter regions begin to inject second type charge carriers, while substantially no second type charge carriers are injected by the first type emitter regions 21. As the current driven through the IGBT increases, the voltage across the first pn-junctions increases and the first type emitter regions 21 start to inject charge carriers when the voltage across the first pn-junctions reaches the first built-in voltage $V_{bi1}$. In this way, the injection of charge carriers by the first type emitter regions 21 and the second type emitter regions is dependent on a current level (or a current-density level) of the current through the IGBT. Mainly the second type emitter regions inject charge carriers when the current level is below a current threshold, which is when the IGBT is in the normal mode, and the first type emitter regions 21 and the second type emitter regions 22 inject charge carriers when the current level is above the current threshold, which is when the IGBT is in the high current mode. For example, the IGBT is in the high current mode when the IGBT is in the on-state and there is a short-circuit in a load connected to the load path (collector-emitter path) of the IGBT.

In the high current mode it is desirable for both the first type emitter regions 21 and the second type emitter regions 22 to inject charge carriers in order to prevent the so-called Egawa or Kirk effect which, in turn, increases the current robustness. Having both the first type emitter regions 21 and the second type emitter regions 22 inject charge carriers results in a high emitter efficiency of the first emitter 20 in the high current mode. Generally, switching losses (turn-off losses) in an IGBT increase as the emitter efficiency increases. However, in the high current mode the focus is on increasing the current robustness by preventing extreme peaks of the electrical field strength close to the first emitter 20.

In the normal mode, the emitter efficiency of the first emitter 20 is lower than in the high current mode as only the second type emitter regions 22 inject charge carriers. This results in low switching losses (turn-off losses) in the normal mode. Furthermore, in the normal mode, the emitter efficiency increases as the current level increases. This is explained in the following.

In the normal mode, the emitter efficiency is governed by the doping concentration of the second type emitter regions and by the presence of the recombination region 24. At a given doping concentration of the second type emitter regions 22 the emitter efficiency of the IGBT with the recombination region 24 is lower than the emitter efficiency of a comparable emitter region without recombination region 24. In the recombination region 24, a portion of the second type charge carriers injected by the second type emitter region 22 in the third type emitter regions 23 recombine so that less charge carriers than injected by the second type emitter regions 22 pass through the third type emitter regions 23 into the base region 10. However, the recombination rate in the recombination region 24 is dependent on the current density of the current flowing through the recombination region, whereas the recombination rate decreases as the current density increases. Thus, the charge carrier lifetime in the recombination region 24 increases as the current density increases. In the normal mode, this increase of the charge carrier lifetime at higher current densities is equivalent to an increasing emitter efficiency at an increasing current density.

The recombination region 24 in the third type regions 23 of the first doping type is more efficient in recombining charge carriers of the second type than the recombination region 24 in the first type emitter regions 21 of the second doping type. Thus, the recombination region 24 also reduces the emitter efficiency of that portion of the first emitter 20 formed by the first type emitter regions 21 but reduces the efficiency of these first type emitter regions 21 less than the efficiency of that portion of the first emitter 20 formed by the second type emitter regions 22.

Measurements have shown that the first emitter 20 with the first type, second type and third type emitter regions 21, 22, 23 helps to increase the current robustness of the IGBT without degrading other performance parameters of the IGBT such as the saturation voltage and the switching losses.

Figure 12:
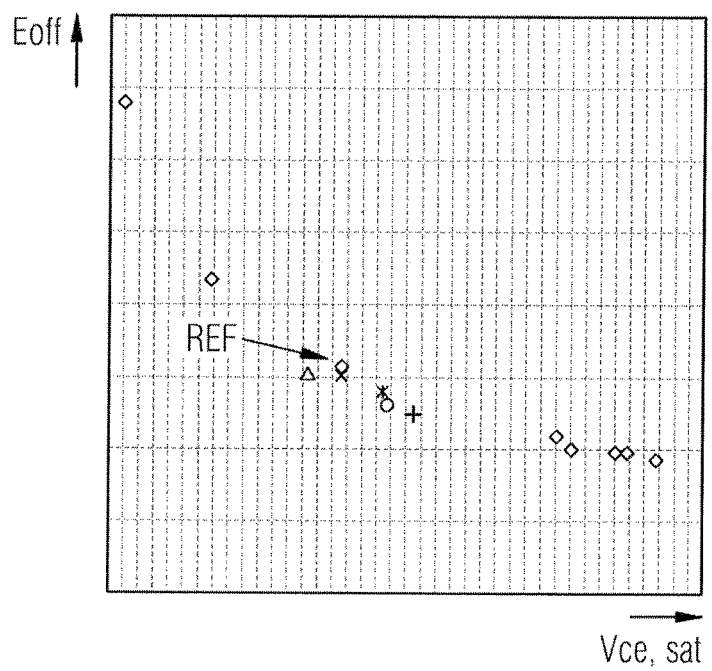
FIG. 12 shows the switching losses versus the saturation voltages of different IGBTs implemented with different first emitter regions.

FIG. 12 shows the saturation voltage Vce,sat versus the turn-off switching losses Eoff of several IGBTs that were implemented with different first emitter regions.

In FIG. 12, the "triangle", the "X", the "star", the "circle", and the "plus" symbols represent the saturation voltage and the corresponding turn-off switching losses of IGBTs implemented with a first emitter region 20 as shown in FIGS. 1 and 3. The "diamond" symbols represent the saturation voltage Vce,sat and the corresponding switching losses Eoff of IGBTs implemented with a conventional (uniform) first emitter. The IGBTs represented by the "diamonds" were produced with different dopant doses of their first emitter, whereas in these conventional IGBTs the saturation voltage increases and the switching losses decrease as the dopant dose of the first emitter decreases. In FIG. 12, REF denotes a conventional IGBT that has a similar saturation voltage Vce,sat and similar switching losses than the IGBTs with the first emitter 20 according to FIG. 1 or 3. This IGBT will be referred to as reference device REF in the following. The IGBTs represented by the "triangle", the "X", the "star", the "circle", and the "plus" have slightly different saturation voltages. This is due to the fact that these IGBTs were produced with different widths w2 of their second type emitter regions, while the width w1 of the first type emitter region 21 was substantially the same in each of these IGBTs.

Figure 13:
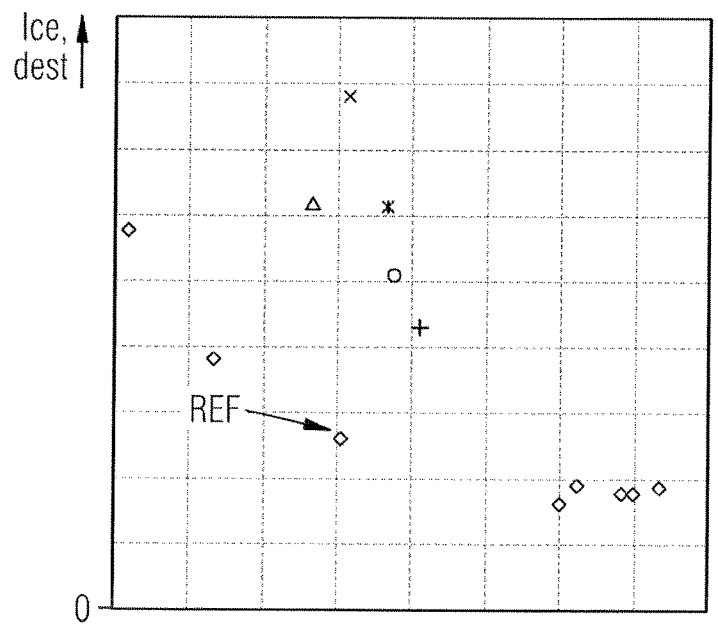
FIG. 13 shows the current robustness (destruction currents) versus the saturation voltages of different IGBTs implemented with different first emitter regions.

FIG. 13 shows the saturation voltage Vce,sat versus the destruction current Ice,dest of the IGBTs explained with reference to FIG. 12. Again, the "diamond" symbols represent IGBTs with a conventional first emitter region, and the "triangle", the "X", the "star", the "circle", and the "plus" represent IGBTs with a first emitter region as shown in one of FIGS. 1 and 3. From FIG. 13, it can be seen that in IGBTs with a conventional first emitter region the destruction current increases as the saturation voltage decreases, wherein, referring to the explanation above, a lower saturation voltage Vce,sat results from a higher dopant dose of the first emitter region. The IGBTs with the first type emitter regions 21 and the second type emitter regions 22, although they are comparable with the reference device REF having a conventional first emitter region in terms of the saturation voltage and the switching losses, are superior in terms of the destruction current. In this specific embodiment, the destruction currents of the IGBTs with the non-conventional first emitter region 20 are between about two times and three times the destruction current of the reference device REF. The specific gain in the destruction current Ice,dest as compared to the reference device REF is dependent on the specific design of the first emitter, in particular on the dimensions of the first type emitter regions 21 and the second type emitter regions 22 in the horizontal and vertical directions of the semiconductor body 100.

Figure 14A:
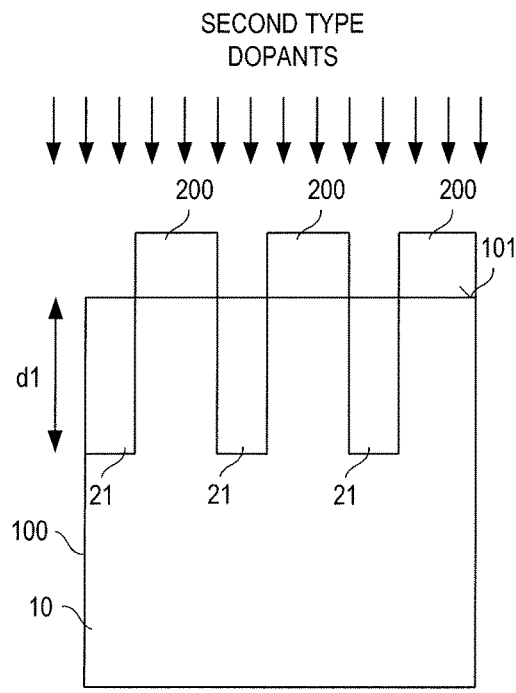
FIGS. 14A-14B illustrate one embodiment of a method for forming first type emitter regions and second type emitter regions.
Figure 14B:
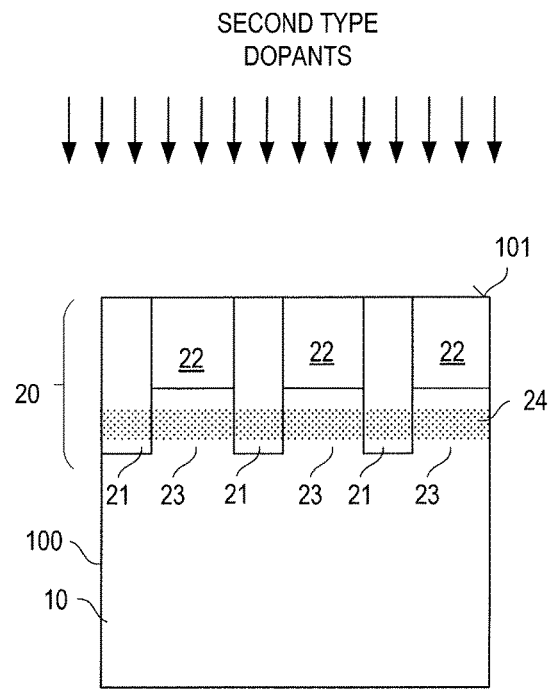

FIGS. 14A and 14B illustrate one embodiment of a method for producing the first emitter region 20. Referring to FIG. 14A, the method includes forming the first type emitter regions 21 by implanting second type dopant atoms via the first surface 101 into the semiconductor body 100 and activating the implanted dopant atoms. Implanting the dopant atoms includes using an implantation mask 200 such that dopant atoms are implanted only in those regions of the first surface 101 uncovered by the implantation mask 200. The implantation dose is, for example, between 1E14 cm$^{-2}$ and 3E15 cm$^{-2}$, in particular between 6E14 cm$^{-2}$ and 9E14 cm$^{-2}$. The implantation energy is, for example, between 10 keV and 200 keV, in particular between 15 keV and 70 keV. Optionally, implanting the dopant atoms includes a further implantation process at higher implantation energies. For example, the implantation dose in this additional implantation process is between 1E12 cm$^{-2}$ and 1E13 cm$^{-2}$, in particular between 3E12 cm$^{-2}$ and 7E12 cm$^{-2}$ and the implantation energy is between 150 keV and 190 keV. Activating the implanted dopant atoms may include an annealing process in which at least those regions of the semiconductor body 100 are annealed in which the dopant atoms have been implanted. According to one embodiment, the annealing process is chosen such that substantially 100% of the implanted dopant atoms are activated. Such annealing process may include a laser annealing process that melts regions of the semiconductor body 100 close the surface 101. That is, a temperature in this laser annealing process is selected such that the region close to the first surface 101 melts. Before this laser annealing process the implantation mask 200 may be removed.

The laser annealing process is chosen such that a depth of the melted region substantially corresponds to the desired depth d1 of the first type emitter regions 21. After the laser annealing process, that is, when the semiconductor body 100 cools off, the melted semiconductor region re-crystallizes and the implanted dopant atoms are incorporated into the crystal lattice of the re-crystallized semiconductor region. In the melted semiconductor region, the implanted dopant atoms diffuse (redistribute) in the vertical direction, so that doping concentration in the first type emitter regions 21 is substantially homogenous after the re-crystallization. The implanted dopant atoms also diffuse in the lateral direction. However, the width w1 of the first type emitter region 21 is significantly higher than the depth d1 so that diffusion in the lateral direction is negligible. That is, the annealing process does not result in a significant widening of the first type emitter regions 21. According to one embodiment, a ratio w1/d1 is in the range of between 2 and 100, in particular between 5 and 50. d1 may be in the range between 0.3 micrometers μm) and 1 μm, and w1 may be in the range between 0.5 μm and 50 μm, particularly between 1 μm and 35 μm, or between 5 μm and 15 μm.

According to one embodiment, the laser anneal process is such that the energy is selected from a range of between 1 J/cm$^2$ and 10 J/cm$^2$, in particular between 1.5 J/cm$^2$ and 4.5 J/cm$^2$.

In another embodiment, the annealing process is chosen such that only less than 100% of the implanted ions are activated. That can be achieved by adjusting the annealing depth with respect to the implantation depth.

Referring to FIG. 14B, the method further includes forming the second type emitter regions 22 by implanting second type dopant atoms and partially activating the implanted dopant atoms. Implanting the second type dopant atoms may include a non-masked implantation so that dopant atoms are implanted into those regions of the first surface 101 that were covered by the implantation mask 200 in the first implantation process explained before, but also into the first type emitter regions 21. In this second implantation process, the implantation dose is, for example, between 1E12 cm$^{-2}$ and 1E15 cm$^{-2}$, in particular between 2E12 cm$^{-2}$ and 1E14 cm$^{-2}$, or between 3E12 cm$^{-2}$ and 1E13 cm$^{-2}$. Suitable dopant atoms in both the first implantation process and the second implantation process are boron atoms, aluminum atoms, indium atoms and gallium atoms, if the second doping type is a p-type.

Activating the second type dopant atoms implanted in the second implantation process may include only partially activating the implanted dopant atoms. That is, only a part of the implanted dopant atoms is activated. Partially activating the implanted dopant atoms may include an annealing process at temperatures of between 300° C. and 500° C., in particular, between 350° C. and 420° C., and a duration of between 0.5 h and 5 h, in particular, between 1 h and 4 h.

Implanting the dopant atoms in the second implantation process generates crystal defects in the semiconductor body 100. In the annealing process at the relatively low temperatures explained above, those crystal defects are not cured but diffuse deeper into the semiconductor body 100 so as to form the recombination region 24. In this recombination region 24, the crystal defects form recombination centers. According to one embodiment, a temperature and duration of the second annealing process are selected such that the recombination region 24 forms inside the first type emitter regions 21 but inside and outside the second type emitter regions 22, whereas a recombination efficiency in the recombination region 24 outside the first and second type emitter regions 21, 22 is higher than in the recombination region 24 inside these regions 21, 22.

According to one embodiment, the recombination region 24 is generated such, that a concentration of recombination centers in the recombination region 24 is such that a charge carrier lifetime in those section of the recombination region 24 that are outside the first and second type emitter regions 21, 22 is between 100 nanoseconds (ns) and 50 microseconds (μs), 500 nanoseconds and 30 microseconds, or 1 microsecond and 20 microseconds. According to one embodiment, a ratio between the charge carrier lifetime in the recombination region 23 in the first type emitter region and the charge carrier lifetime in the recombination region 23 in the third type emitter region 23 is between 2 and 4.

Figure 15:
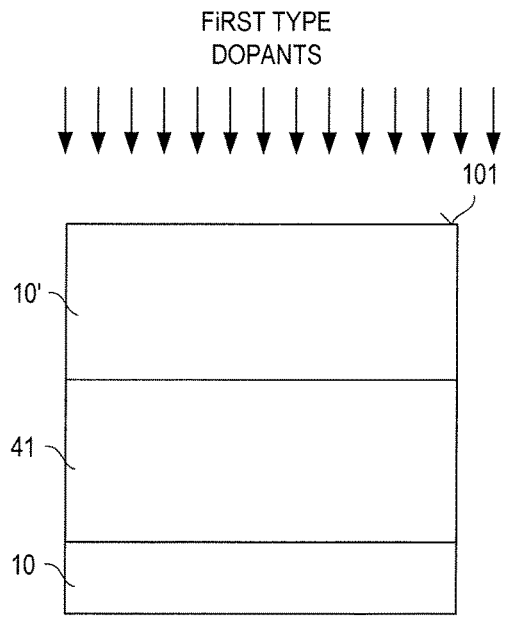
FIG. 15 illustrates one embodiment of a method for forming a field-stop region.

The first emitter region 20 shown in FIG. 14B corresponds to the first emitter region shown in FIG. 1. A first emitter region 20 shown in FIG. 3 can be obtained by forming the field stop region 41 before producing the first type emitter regions 21 and the second type emitter regions 22, respectively. Referring to FIG. 15, forming the field stop region 41 may include implanting first type dopant atoms via the first surface 101 into the semiconductor body 100. Alternatively, those dopant atoms are implanted via the second surface. Implanting the first type dopant atoms may include several implanting processes at different implantation energies so as to obtain a field stop region 41 with two or more spaced apart doping maxima. For example, the implanted atoms include at least one of selenium (Se), phosphorous (P), arsenic (As), and antimony (Sb). Alternatively, hydrogen (H) atoms may be implanted which can form donor like complexes with radiation induced damages (e.g., vacancies). Forming the field stop region 41 may further include an annealing process so as to at least partially activate the implanted dopant atoms. Forming a field stop region 41 of the type explained with reference to FIG. 3 is known so that no further explanations are required in this regard.

Figure 16:
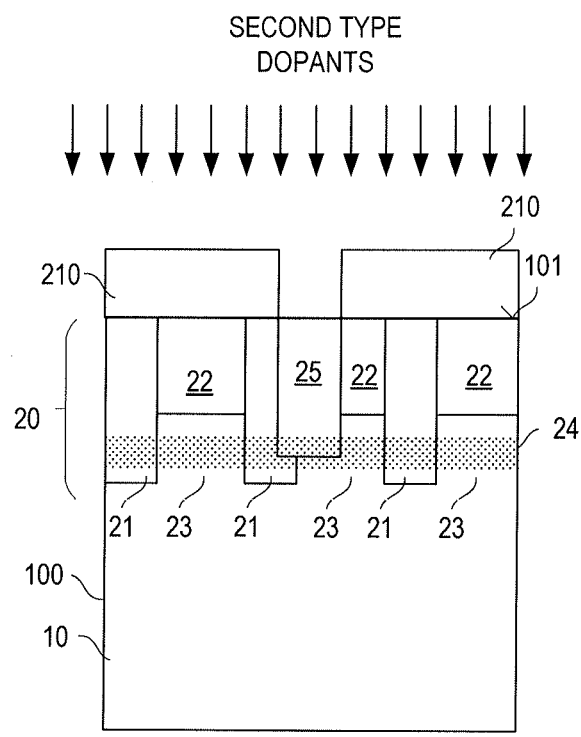
FIG. 16 illustrates forming at least one third type emitter region.

Referring to FIG. 16, the method may further includes forming at least one fourth type emitter region 25 of the second doping type by implanting dopant atoms via the first surface 101 using an implantation mask 210 and activating the implanted dopant atoms. The at least one fourth type emitter region 25 may be formed before forming the first type and the second type emitter regions 21, 22, or may be formed after forming the first type emitter region and the second type emitter regions 21, 22 (as shown in FIG. 16). The at least one third type emitter region is produced to have a doping concentration higher than the doping concentration of the second type emitter regions 22 and lower than a doping concentration of the first type emitter regions 21.

Referring to FIG. 16, the implantation mask can be chosen such that parts of the at least one fourth type emitter region 25 are produced in the first type emitter region 21 and the second type emitter region. However, due to the doping concentration lower than the doping concentration of the first type emitter regions 21 the fourth type emitter region 25 is effective only in those regions where it is produced in the second type emitter regions 22. In the vertical direction, the third type emitter region may extend into the base region or the field stop region, respectively. The at least one fourth type emitter region additionally to the first type emitter regions 21 helps to counteract the Egawa effect when turning off the device.

The shape of the at least one fourth type emitter region is independent of the shape of the first and second type emitter regions. Several examples of how the at least one fourth type emitter region 25 may be implemented are explained with reference to FIGS. 17 and 18 below. In these figures, which show a top view of the first surface, the first and second type emitter regions 21, 22 (illustrated in dotted lines, are implemented as stripes (that is, with an elongated shape). However, this is only an example, any other shape explained herein before may be used as well.

Figure 17:
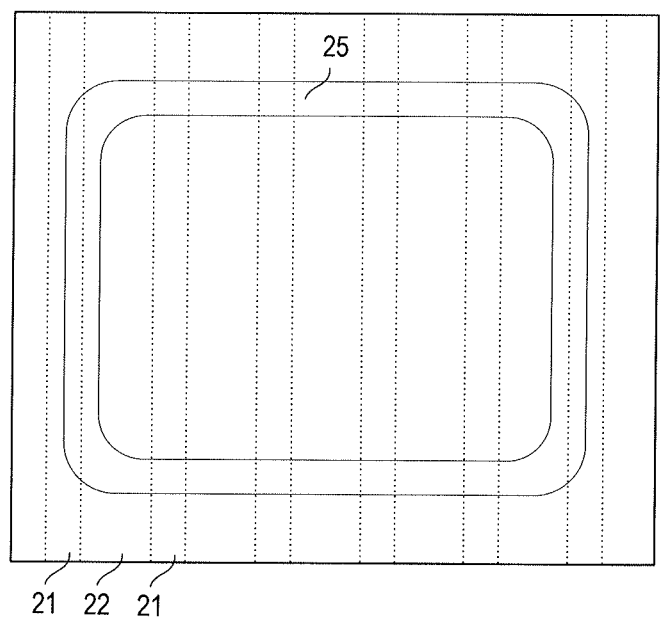
FIG. 17 shows one embodiment of the third type emitter region.

In the embodiment shown in FIG. 17, the at least one fourth type emitter region 25 is ring-shaped. In this embodiment, only one fourth type emitter region 25 is shown. However, the device may be implemented with two or more third type emitter regions, which may be implemented as concentric rings.

Figure 18:
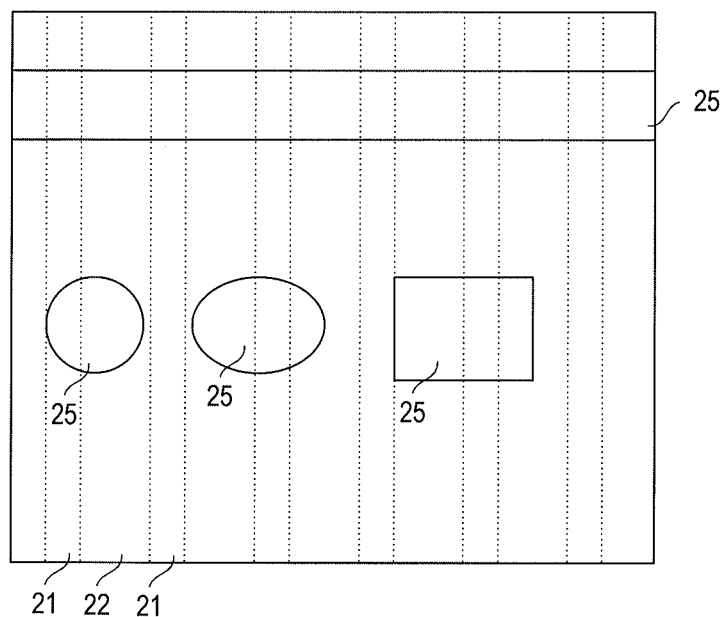
FIG. 18 shows further embodiments of the at least one third type emitter region.

Referring to FIG. 18, which shows different embodiments of how the at least one fourth type emitter region 25 may be implemented, the fourth type emitter region 25 can be elongated or pile-shaped (for example, with a circular, elliptical or rectangular cross section).

For example, a width of the fourth type semiconductor region 25 is at least 2 times, 5 times, or even more than 10 times the width w1 of the first type emitter region 21. The "width" of the fourth type emitter region 25 is the smallest lateral dimension of the fourth type emitter region. For example, in case of the ring-shaped region 25 shown in FIG. 17, the width is the width of the elongated region forming the ring. An implantation dose for producing the fourth type emitter region 25 is, for example, selected from a range of between $1E10$ $cm^{-2}$ and $1E14$ $cm^{-2}$, from a range of between $3E12$ $cm^{-2}$ and $5E13$ $cm^{-2}$, or from a range of between $5E12$ $cm^{-2}$ and $3E13$ $cm^{-2}$. The annealing may include a laser annealing process in which at least those regions are melted into which dopant atoms were introduced.

Unless stated otherwise, features explained herein before with reference to one drawing may be combined with features explained with reference to any other drawing.

The invention claimed is:

1. A bipolar semiconductor device, comprising:
   a semiconductor body having a first surface;
   a base region of a first doping type and a first emitter region in the semiconductor body, and
   a field-stop region of the first doping type between the base region and the first emitter region,
   wherein:
      the first emitter region adjoins the first surface and comprises a plurality of first type emitter regions of a second doping type complementary to the first doping type, a plurality of second type emitter regions of the second doping type, a plurality of third type emitter regions of the first doping type, and a recombination region comprising recombination centers,
      the first type emitter regions and the second type emitter regions extend from the first surface into the semiconductor body,
      the first type emitter regions have a higher doping concentration and extend deeper into the semiconductor body from the first surface than the second type emitter regions,
      the third type emitter regions adjoin the first type emitter regions and the second type emitter regions, and
      the recombination region is located at least in the first type emitter regions and the third type emitter regions; and
      a doping concentration of the field-stop region is higher than the doping concentration of the base region.

2. The bipolar semiconductor device of claim 1, wherein a ratio between a minimum doping concentration of the field-stop region and a maximum doping concentration of the base region is between 2 and 4.

3. A method, comprising:
   in a first implantation process, implanting dopant atoms of one conductivity type into first surface sections of a first surface of a semiconductor body, and covering second surface sections of the first surface during the implanting;
   in a first activation process, activating at least a part of the dopant atoms implanted in the first implantation process to form first doped regions below the first surface sections;
   in a second implantation process, implanting dopant atoms of the one conductivity type into the first surface sections and the second surface sections; and
   in a second activation process, activating only a part of the dopant atoms implanted in the second implantation process to form second doped regions and recombination regions such that the recombination regions are more spaced apart from the second surface regions than the second doped regions, wherein activating at least a part of the dopant atoms implanted in the first implantation process comprises a laser anneal process.

4. The method of claim 3, wherein a duration of the laser anneal process is between 100 and 1000 nanoseconds.

5. A method, comprising:

in a first implantation process, implanting dopant atoms of one conductivity type into first surface sections of a first surface of a semiconductor body, and covering second surface sections of the first surface during the implanting;

in a first activation process, activating at least a part of the dopant atoms implanted in the first implantation process to form first doped regions below the first surface sections;

in a second implantation process, implanting dopant atoms of the one conductivity type into the first surface sections and the second surface sections; and in a second activation process, activating only a part of the dopant atoms implanted in the second implantation process to form second doped regions and recombination regions such that the recombination regions are more spaced apart from the second surface regions than the second doped regions, wherein activating only a part of the dopant atoms implanted in the second implantation process comprises an annealing process at temperatures of between 350 and 450° C.

6. A method, comprising:

in a first implantation process, implanting dopant atoms of one conductivity type into first surface sections of a first surface of a semiconductor body, and covering second surface sections of the first surface during the implanting;

in a first activation process, activating at least a part of the dopant atoms implanted in the first implantation process to form first doped regions below the first surface sections;

in a second implantation process, implanting dopant atoms of the one conductivity type into the first surface sections and the second surface sections; and in a second activation process, activating only a part of the dopant atoms implanted in the second implantation process to form second doped regions and recombination regions such that the recombination regions are more spaced apart from the second surface regions than the second doped regions, wherein the dopant atoms in at least one of the first implantation process and the second implantation process are selected from the group consisting of:
boron atoms;
aluminum atoms;
indium atoms; and
gallium atoms.

7. A method, comprising:

in a first implantation process, implanting dopant atoms of one conductivity type into first surface sections of a first surface of a semiconductor body, and covering second surface sections of the first surface during the implanting;

in a first activation process, activating at least a part of the dopant atoms implanted in the first implantation process to form first doped regions below the first surface sections;

in a second implantation process, implanting dopant atoms of the one conductivity type into the first surface sections and the second surface sections; and in a second activation process, activating only a part of the dopant atoms implanted in the second implantation process to form second doped regions and recombination regions such that the recombination regions are more spaced apart from the second surface regions than the second doped regions, wherein the first surface sections are elliptic surface sections.

* * * * *